(12) United States Patent
Shi

(10) Patent No.: US 9,564,260 B2
(45) Date of Patent: Feb. 7, 2017

(54) METHOD FOR PREPARING A SILICON DIOXIDE SUBSTRATE-BASED GRAPHENE TRANSPARENT CONDUCTIVE FILM

(71) Applicant: BOE TECHNOLOGY GROUP CO., LTD., Beijing (CN)

(72) Inventor: Yue Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 14/445,589

(22) Filed: Jul. 29, 2014

(65) Prior Publication Data
US 2015/0235743 A1 Aug. 20, 2015

(30) Foreign Application Priority Data
Feb. 17, 2014 (CN) .......................... 2014 1 0053173

(51) Int. Cl.
H01L 21/31 (2006.01)
C01B 31/04 (2006.01)
(Continued)

(52) U.S. Cl.
CPC ........... *H01B 13/0026* (2013.01); *C23C 16/01* (2013.01); *C23C 16/26* (2013.01); *C23C 16/44* (2013.01);
(Continued)

(58) Field of Classification Search
CPC ............... H01L 21/02376; H01L 21/02444; H01L 29/1606; H01L 2251/5338; H01L 31/022466; H01L 51/0045; H01L 51/442; H01L 21/022; H01L 21/02527; C01B 2204/02; C01B 2204/04; C01B 2204/32; C01B 31/04; C01B 31/0438; C01B 31/0446; C01B 31/0484; C23C 16/01; C23C 16/26; Y10T 428/30; B23B 37/025

See application file for complete search history.

(56) References Cited

U.S. PATENT DOCUMENTS

| | | | |
|---|---|---|---|
| 2012/0070641 A1 | 3/2012 | Choi et al. | |
| 2012/0225296 A1* | 9/2012 | Zhong | B82Y 30/00 428/408 |
| 2014/0130972 A1* | 5/2014 | Ren | C25B 1/00 156/249 |

FOREIGN PATENT DOCUMENTS

| | | |
|---|---|---|
| CN | 101474899 A | 7/2009 |
| CN | 102351175 A | 2/2012 |

(Continued)

OTHER PUBLICATIONS

First Office Action regarding Chinese application No. 201410053173.X, dated Aug. 25, 2015. Translation provided by Dragon Intellectual Property Law Firm.

*Primary Examiner* — Pamela E Perkins
(74) *Attorney, Agent, or Firm* — Harness, Dickey & Pierce, P.L.C.

(57) ABSTRACT

The present invention provides a method for preparing a silicon dioxide substrate-based graphene transparent conductive film, which comprises: preparing a silicon dioxide substrate on a graphene transparent conductive film, thereby obtaining a silicon dioxide substrate-based graphene transparent conductive film. In the method for preparing a silicon dioxide substrate-based graphene transparent conductive film according to the embodiments of the present invention, the silicon dioxide substrate is prepared on the graphene transparent conductive film, and a graphene transferring step that is difficult to implement in the prior art can be avoided, thus the silicon dioxide substrate-based graphene transparent conductive film can be prepared conveniently, and the cost may be reduced at the same time.

15 Claims, 2 Drawing Sheets

(51) Int. Cl.
*C23C 16/01* (2006.01)
*H01B 13/00* (2006.01)
*C23C 16/26* (2006.01)
*C23C 16/44* (2006.01)
*C23F 1/00* (2006.01)
*H01B 13/30* (2006.01)
*C23C 16/56* (2006.01)
*C23C 18/12* (2006.01)
*H01B 1/04* (2006.01)

(52) U.S. Cl.
CPC ............... *C23C 16/56* (2013.01); *C23C 18/12* (2013.01); *C23F 1/00* (2013.01); *H01B 1/04* (2013.01); *H01B 13/30* (2013.01)

(56) References Cited

FOREIGN PATENT DOCUMENTS

| | | |
|---|---|---|
| CN | 102909005 A | 2/2013 |
| CN | 103013824 A | 4/2013 |

\* cited by examiner

METHOD FOR PREPARING A SILICON DIOXIDE SUBSTRATE-BASED GRAPHENE TRANSPARENT CONDUCTIVE FILM

CROSS REFERENCE TO RELATED APPLICATION

This application claims priority to Chinese Patent Application No. 201410053173.X filed on Feb. 17, 2014, the disclosures of which are incorporated in their entirety by reference herein.

FIELD OF THE INVENTION

The present invention relates to the field of preparing a graphene transparent conductive film, and in particular, to a method for preparing a silicon dioxide substrate-based graphene transparent conductive film.

DESCRIPTION OF THE PRIOR ART

In the existing method for preparing a silicon dioxide substrate-based graphene transparent conductive film, firstly a monolayer of graphene film is prepared on a metal substrate via Chemical Vapor Deposition (CVD), and then the graphene film on the metal substrate is transferred onto a $SiO_2$ (silicon dioxide) substrate.

The process flow of the existing method for preparing a silicon dioxide substrate-based graphene transparent conductive film is as follows:

1) preparing a monolayer of graphene film on a copper foil substrate via CVD;
2) coating of transfer medium: a transfer medium is coated onto the surface of the monolayer of graphene film, generally via spin coating;
3) Cu (copper) etching: the copper foil substrate provided with the monolayer of graphene film and the transfer medium is placed in a copper-etching solution to etch off the copper foil substrate;
4) graphene transferring: transferring the monolayer of graphene film coated with the transfer medium onto a silicon dioxide substrate (for example, placing a silicon dioxide substrate in the etching groove in advance, and then the monolayer of graphene film coated with the transfer medium is integrated with the silicon dioxide substrate by way of "salvaging"; however, such a method is not applicable for large-area transfer); and
5) removing of transfer medium: the transfer medium is washed off, generally by acetone, and then dried.

However, in the above process flow, it is very difficult to implement the graphene transferring step; especially, it is difficult to implement transferring of large-sized graphene without causing any damage, and the transferring cost is very high.

SUMMARY OF THE INVENTION

The present invention provides a method for preparing a silicon dioxide substrate-based graphene transparent conductive film, thereby the problem of the existing method for preparing a graphene transparent conductive film that it is difficult to implement transferring of a large-sized graphene without causing any damage may be solved.

In order to achieve the above object, the present invention provides a method for preparing a silicon dioxide substrate-based graphene transparent conductive film, which comprises: preparing a silicon dioxide substrate on a graphene transparent conductive film, thereby obtaining the silicon dioxide substrate-based graphene transparent conductive film.

According to an embodiment of the present invention, the method for preparing a silicon dioxide substrate-based graphene transparent conductive film according to the present invention specifically comprises:

a graphene transparent conductive film preparation step: preparing the graphene transparent conductive film on a metal substrate to form a first substrate;

a silicon dioxide substrate preparation step: preparing the silicon dioxide substrate on the graphene transparent conductive film; and an etching step: etching off the metal substrate, thereby obtaining the silicon dioxide substrate-based graphene transparent conductive film.

According to an embodiment of the present invention, the silicon dioxide substrate preparation step specifically comprises:

a silicon dioxide sol layer forming step: forming a silicon dioxide sol layer on a surface of the graphene transparent conductive film; and a drying step: drying the first substrate, on a surface of which the silicon dioxide sol layer is formed, to prepare the silicon dioxide substrate on the graphene transparent conductive film.

According to an embodiment of the present invention, the silicon dioxide sol layer forming step further comprises: preparing silicon dioxide sol on the surface of the graphene transparent conductive film via spin coating to form the silicon dioxide sol layer, wherein the spinning speed of the spin coating is 100 revolutions/minute to 900 revolutions/minute.

According to an embodiment of the present invention, the silicon dioxide sol layer forming step further comprises: preparing silicon dioxide sol on the surface of the graphene transparent conductive film via blade coating to form the silicon dioxide sol layer, wherein the speed of the blade coating is 0.1 cm/second to 1 cm/second.

According to an embodiment of the present invention, the silicon dioxide sol layer forming step further comprises: preparing silicon dioxide sol on the surface of the graphene transparent conductive film via infiltration to form the silicon dioxide sol layer, wherein the infiltration time is 10 minutes to 60 minutes.

According to an embodiment of the present invention, the thickness of the silicon dioxide sol layer formed on the surface of the graphene transparent conductive film is 1 micron to 30 microns.

According to an embodiment of the present invention, in the silicon dioxide sol layer forming step, the rotational viscosity of silicon dioxide sol is greater than or equal to 8 MPa·s and less than or equal to 15 MPa·s.

According to an embodiment of the present invention, in the silicon dioxide sol layer forming step, the concentration of silicon dioxide sol is greater than or equal to 35% and less than or equal to 55%.

According to an embodiment of the present invention, the silicon dioxide sol layer forming step further comprises a silicon dioxide sol forming step: mixing tetraethylorthosilicate, water, ethanol and ammonia water and stirring at a temperature of 20° C. to 40° C. so as to form silicon dioxide sol, wherein the mole number of tetraethylorthosilicate is greater than or equal to 0.5 and less than or equal to 2, and the mole number of ethanol is greater than or equal to 2 and less than or equal to 12.

According to an embodiment of the present invention, the metal substrate is a copper foil substrate.

According to an embodiment of the present invention, in the graphene transparent conductive film preparation step, hydrocarbon is used as a carbon source and chemical vapor deposition is employed as a carbon forming method.

According to an embodiment of the present invention, wherein the temperature required for the chemical vapor deposition is between 800° C. and 1200° C.

In comparison with the prior art, in the method for preparing a silicon dioxide substrate-based graphene transparent conductive film according to the embodiments of the present invention, the silicon dioxide substrate is prepared on the graphene transparent conductive film, and a graphene transferring step that is difficult to implement in the prior art can be avoided, thus the silicon dioxide substrate-based graphene transparent conductive film may be prepared conveniently, and the cost may be reduced at the same time.

DETAILED DESCRIPTION OF THE PREFERRED EMBODIMENTS

Hereafter, the method for preparing a silicon dioxide substrate-based graphene transparent conductive film according to the present invention will be introduced in conjunction with specific embodiments.

The method for preparing a silicon dioxide substrate-based graphene transparent conductive film according to the embodiments of the present invention includes: preparing a silicon dioxide substrate on a graphene transparent conductive film, thereby obtaining a silicon dioxide substrate-based graphene transparent conductive film.

In the method for preparing a silicon dioxide substrate-based graphene transparent conductive film according to the embodiments of the present invention, a silicon dioxide substrate is prepared on a graphene transparent conductive film, rather than transferring the graphene to a silicon dioxide substrate as required in the prior art, a graphene transferring step that is difficult to implement can be avoided, so that a silicon dioxide substrate-based graphene transparent conductive film may be easily obtained, the method is easy to implement and the cost is low.

Figure 1:
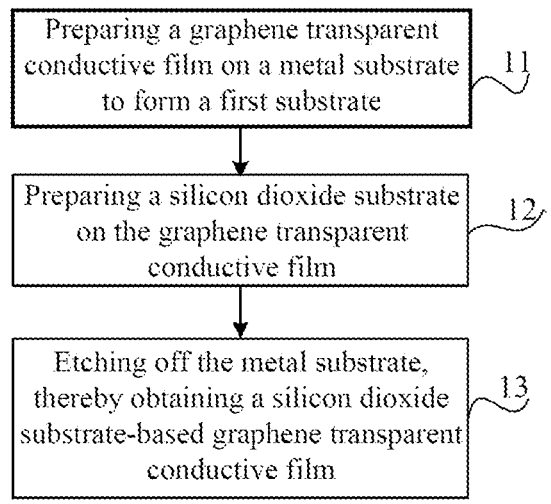
FIG. 1 shows a flow chart of the method for preparing a silicon dioxide substrate-based graphene transparent conductive film according to the embodiments of the present invention.

During specific implementation, the graphene transparent conductive film is very thin and it is difficult to directly prepare a silicon dioxide substrate on a graphene transparent conductive film, thus the graphene transparent conductive film has to be prepared on a metal substrate first, and then the silicon dioxide substrate is prepared on the graphene transparent conductive film. Here, the metal substrate has a function of supporting. After that, the metal substrate is etched off, and finally a silicon dioxide substrate-based graphene transparent conductive film is obtained. Specifically, as shown in FIG. 1, the method for preparing a silicon dioxide substrate-based graphene transparent conductive film according to the embodiments of the present invention may further include:

a graphene transparent conductive film preparation step 11: preparing a graphene transparent conductive film on a metal substrate to form a first substrate;

a silicon dioxide substrate preparation step 12: preparing a silicon dioxide substrate on the graphene transparent conductive film; and an etching step 13: etching off the metal substrate, thereby obtaining a silicon dioxide substrate-based graphene transparent conductive film.

According to a specific embodiment, the graphene transparent conductive film preparation step includes:

preparing a graphene transparent conductive film on a metal substrate by using hydrocarbon as the carbon source and CVD as the carbon forming method.

According to a specific embodiment, when preparing the graphene transparent conductive film on the metal substrate, the temperature required for CVD is between 800° C. and 1200° C.

According to a specific embodiment, the silicon dioxide substrate preparation step may include:

a silicon dioxide sol layer forming step: forming a silicon dioxide sol layer on the surface of the graphene transparent conductive film;

a drying step: drying the first substrate, on the surface of which the silicon dioxide sol layer is formed, to prepare the silicon dioxide substrate on the graphene transparent conductive film.

According to a specific embodiment, the silicon dioxide sol layer forming step specifically comprises:

a silicon dioxide sol forming step, wherein the rotational viscosity of the silicon dioxide sol is greater than or equal to 8 MPa·s and less than or equal to 15 MPa·s, and the concentration of the silicon dioxide sol is greater than or equal to 35% and less than or equal to 55%; and preparing the silicon dioxide sol on the surface of the graphene transparent conductive film via spin coating, infiltration or blade coating, thereby forming the silicon dioxide sol layer.

When preparing the silicon dioxide sol on the graphene transparent conductive film, the graphene transparent conductive film is very thin and it is prone to break when an external force is applied, thereby the conductivity and integrality of the graphene transparent conductive film will be influenced. Therefore, in order to guarantee that the harm to the graphene transparent conductive film is minimized, during practical operation, the process below may be employed for preparing the silicon dioxide sol on the graphene transparent conductive film to form the silicon dioxide sol layer:

preparing the silicon dioxide sol on the surface of the graphene transparent conductive film via spin coating to form a silicon dioxide sol layer, wherein the spinning speed of the spin coating is 100 r/min (revolutions/minute) to 900 r/min, and the thickness of the silicon dioxide sol layer formed on the surface of the graphene transparent conductive film is 1 μm (micron) to 30 μm;

preparing the silicon dioxide sol on the surface of the graphene transparent conductive film via blade coating to form a silicon dioxide sol layer, wherein the speed of the blade coating is 0.1 cm/s (cm/second) to 1 cm/s, and the thickness of the silicon dioxide sol layer formed on the surface of the graphene transparent conductive film is 1 μm (micron) to 30 μm;

preparing the silicon dioxide sol on the surface of the graphene transparent conductive film via infiltration to form a silicon dioxide sol layer, wherein the infiltration time is 10 min (minutes) to 60 min, and the thickness of the silicon dioxide sol layer formed on the surface of the graphene transparent conductive film is 1 μm (micron) to 30 μm.

According to a specific embodiment, the silicon dioxide sol forming step includes: mixing tetraethylorthosilicate, water, ethanol and ammonia water proportionally, and stifling at a temperature of 20° C. to 40° C. to form a silicon dioxide sol, until the rotational viscosity of the silicon dioxide sol reaches a predetermined rotational viscosity;

specifically, the mole number of tetraethylorthosilicate is greater than or equal to 0.5 and less than or equal to 2, and the mole number of ethanol is greater than or equal to 2 and less than or equal to 12; here, mole number refers to the number of basic units contained in 1 mole of a substance;

tetraethylorthosilicate is taken as the silicon source, water and ethanol are taken as the solvent, and ammonia water is taken as the catalyst; and the predetermined rotational viscosity is greater than or equal to 8 MPa·s and less than or equal to 15 MPa·s.

FIG. 2A, FIG. 2B, FIG. 2C, FIG. 2D and FIG. 2E show a process flow of a method for preparing a graphene transparent conductive film on a silicon dioxide substrate according to a specific embodiment of the present invention.

Figure 2A:
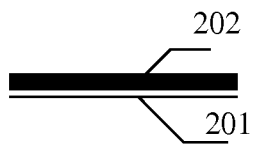
FIG. 2A, FIG. 2B, FIG. 2C, FIG. 2D and FIG. 2E show a process flow of a method for preparing a graphene transparent conductive film on a silicon dioxide substrate according to a specific embodiment of the present invention.
Figure 2B:
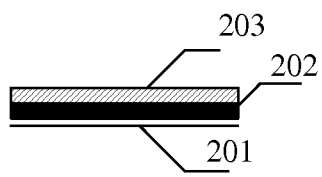
Figure 2C:
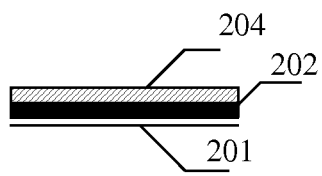
Figure 2D:
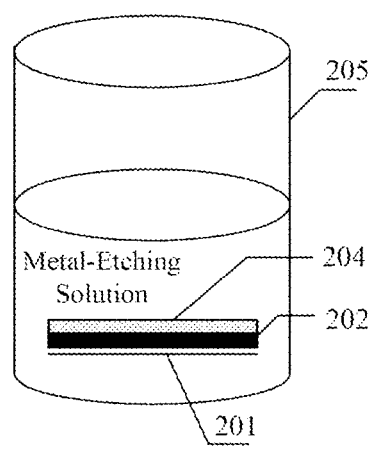
Figure 2E:
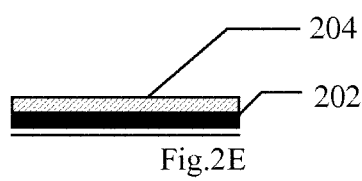

First of all, as shown in FIG. 2A, a graphene transparent conductive film 202 is prepared on a metal substrate 201, thereby a first substrate is formed;

then, as shown in FIG. 2B, a silicon dioxide sol layer 203 is prepared on the surface of the graphene transparent conductive film 202;

as shown in FIG. 2C, the first substrate, on the surface of which the silicon dioxide sol layer 203 is prepared, is dried, and a silicon dioxide substrate 204 is formed on the graphene transparent conductive film 202, thereby a second substrate is formed;

as shown in FIG. 2D, the second substrate is placed into a vessel 205 containing a metal-etching solution;

as shown in FIG. 2E, after the metal substrate 201 included in the second substrate is etched off by the metal-etching solution, the second substrate is taken out from the vessel 205 and washed, thereby a graphene transparent conductive film 202 based on the silicon dioxide substrate 204 is obtained.

In this specific embodiment, a copper foil substrate may be employed as the metal substrate, and the process of the method for preparing a silicon dioxide substrate-based graphene transparent conductive film according to the present invention is as follows:

preparing a graphene transparent conductive film on a copper foil substrate at a temperature of 1000° C. by taking alkane as the carbon source and CVD as the carbon forming method;

preparing a concentrated $SiO_2$ sol on the surface of the graphene transparent conductive film via spin coating or infiltration;

placing the copper foil substrate, on the surface of which the graphene transparent conductive film and the concentrated $SiO_2$ sol are prepared in sequence, in a vacuum drying oven, vacuum-drying for 3 hours to 7 hours, and finally obtaining a silicon dioxide substrate-based graphene transparent conductive film; and placing the copper foil substrate, on the surface of which the graphene transparent conductive film the $SiO_2$ substrate are prepared in sequence, into a copper-etching solution, and etching off the copper foil, wherein the copper-etching solution is generally a ferric chloride solution; and washing the silicon dioxide-graphene substrate, which is obtained after etching off the copper foil, in deionized water, and drying the silicon dioxide-graphene substrate, and finally obtaining a silicon dioxide substrate-based graphene transparent conductive film.

The above descriptions of the present invention are only illustrative, rather than limitative. Various modifications, variations or equivalent substitutions may be made by one skilled in the art without departing from the spirit and scope of the present invention as defined by the appended claims, and all these modifications, variations or equivalent substitutions will fall into the protection scope of the present invention.

What is claimed is:

1. A method for preparing a silicon dioxide substrate-based graphene transparent conductive film, which prepares a silicon dioxide substrate on a graphene transparent conductive film, and thereby obtains the silicon dioxide substrate-based graphene transparent conductive film, wherein the preparing step comprises:
   (1) a graphene transparent conductive film preparation step of preparing the graphene transparent conductive film on a metal substrate to form a first substrate;
   (2) a silicon dioxide substrate preparation step of preparing the silicon dioxide substrate on the graphene transparent conductive film so as to obtain a laminated structure that consists of the metal substrate, the graphene transparent conductive film, and the silicon dioxide substrate which are sequentially arranged; and
   (3) an etching step of etching off the metal substrate, thereby obtaining the silicon dioxide substrate-based graphene transparent conductive film.

2. The method according to claim 1, wherein the silicon dioxide substrate preparation step comprises:
   a silicon dioxide sol layer forming step of forming a silicon dioxide sol layer on a surface of the graphene transparent conductive film; and
   a drying step of drying the first substrate, on a surface of which the silicon dioxide sol layer is formed, to prepare the silicon dioxide substrate on the graphene transparent conductive film.

3. The method according to claim 2, wherein the silicon dioxide sol layer forming step further comprises:
   preparing silicon dioxide sol on the surface of the graphene transparent conductive film via spin coating to form the silicon dioxide sol layer, wherein the spinning speed of the spin coating is 100 revolutions/minute to 900 revolutions/minute.

4. The method according to claim 2, wherein the silicon dioxide sol layer forming step further comprises:
   preparing silicon dioxide sol on the surface of the graphene transparent conductive film via blade coating to form the silicon dioxide sol layer, wherein the speed of the blade coating is 0.1 cm/second to 1 cm/second.

5. The method according to claim 2, wherein the silicon dioxide sol layer forming step further comprises:
   preparing silicon dioxide sol on the surface of the graphene transparent conductive film via infiltration to form the silicon dioxide sol layer, wherein the infiltration time is 10 minutes to 60 minutes.

6. The method according to claim 2, wherein the thickness of the silicon dioxide sol layer formed on the surface of the graphene transparent conductive film is 1 micron to 30 microns.

7. The method according to claim 3, wherein the thickness of the silicon dioxide sol layer formed on the surface of the graphene transparent conductive film is 1 micron to 30 microns.

8. The method according to claim 4, wherein the thickness of the silicon dioxide sol layer formed on the surface of the graphene transparent conductive film is 1 micron to 30 microns.

9. The method according to claim 5, wherein the thickness of the silicon dioxide sol layer formed on the surface of the graphene transparent conductive film is 1 micron to 30 microns.

10. The method according to claim 2, wherein in the silicon dioxide sol layer forming step, the rotational viscosity of silicon dioxide sol is greater than or equal to 8 MPa·s and less than or equal to 15 MPa·s.

11. The method according to claim 2, wherein in the silicon dioxide sol layer forming step, the concentration of silicon dioxide sol is greater than or equal to 35% and less than or equal to 55%.

12. The method according to claim 2, wherein the silicon dioxide sol layer forming step further comprises a silicon dioxide sol forming step of mixing tetraethylorthosilicate, water, ethanol and ammonia water and stirring at a temperature of 20° C. to 40° C. so as to form silicon dioxide sol, wherein the mole number of tetraethylorthosilicate is greater than or equal to 0.5 and less than or equal to 2, and the mole number of ethanol is greater than or equal to 2 and less than or equal to 12.

13. The method according to claim 1, wherein the metal substrate is a copper foil substrate.

14. The method according to claim 1, wherein in the graphene transparent conductive film preparation step, hydrocarbon is used as a carbon source and chemical vapor deposition is employed as a carbon forming method.

15. The method according to claim 14, wherein the temperature required for the chemical vapor deposition is between 800° C. and 1200° C.

* * * * *